United States Patent
Do et al.

(10) Patent No.: US 8,633,059 B2
(45) Date of Patent: Jan. 21, 2014

(54) INTEGRATED CIRCUIT PACKAGING SYSTEM WITH INTERCONNECT AND METHOD OF MANUFACTURE THEREOF

(75) Inventors: Byung Tai Do, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 205 days.

(21) Appl. No.: 13/105,814

(22) Filed: May 11, 2011

(65) Prior Publication Data

US 2012/0286432 A1    Nov. 15, 2012

(51) Int. Cl.
*H01L 21/00*    (2006.01)
(52) U.S. Cl.
USPC ........... 438/109; 257/678; 257/733; 257/777; 257/E21.499; 257/E23.142; 438/107; 438/108
(58) Field of Classification Search
USPC ................. 257/678–733, 787–796, 257/E23.001–E23.194
See application file for complete search history.

(56) References Cited

U.S. PATENT DOCUMENTS

| | | | |
|---|---|---|---|
| 6,084,308 A | 7/2000 | Kelkar et al. | |
| 7,354,800 B2 | 4/2008 | Carson | |
| 7,659,609 B2 | 2/2010 | Ha et al. | |
| 7,701,040 B2 | 4/2010 | Huang et al. | |
| 7,923,290 B2 | 4/2011 | Ko et al. | |
| 2008/0280396 A1* | 11/2008 | Kim et al. | 438/109 |
| 2009/0057863 A1* | 3/2009 | Chow et al. | 257/686 |
| 2010/0065948 A1 | 3/2010 | Bae et al. | |

* cited by examiner

*Primary Examiner* — Mamadou Diallo
(74) *Attorney, Agent, or Firm* — Ishimaru & Associates LLP

(57) ABSTRACT

A method of manufacture of an integrated circuit packaging system includes: providing a base carrier; providing a first integrated circuit having a first integrated circuit inactive side and a first integrated circuit active side; coupling a second integrated circuit, having a second integrated circuit inactive side and a second integrated circuit active side, to the first integrated circuit in an active-to-active configuration; attaching the first integrated circuit over the base carrier; attaching a redistribution structure over the first integrated circuit; and forming a base encapsulation over the redistribution structure, the base encapsulation having a recess partially exposing the redistribution structure.

12 Claims, 5 Drawing Sheets

INTEGRATED CIRCUIT PACKAGING SYSTEM WITH INTERCONNECT AND METHOD OF MANUFACTURE THEREOF

TECHNICAL FIELD

The present invention relates generally to an integrated circuit packaging system, and more particularly to a system for an integrated circuit packaging system with interconnect.

BACKGROUND ART

Currently, the trend of most electronic devices toward being slim, compact, lightweight, and multi-function is inevitable. Therefore, the traditional single chip packaging technology cannot satisfy the requirement. In view of the above, the development point of package techniques is to reduce their packaging size and packaging thickness by using various stacking package techniques to package the different kinds of functional chips.

For example, one of the stacking package techniques is package on package (POP). It may stack two individual chip packages as a single unit. The two chip packages are packaged and tested respectively and then stacked to adhere with each other, to reduce the process risk and elevate the qualified production rate. In the conventional package on package structure, two chip packages may be electrically connected by using solder.

These stacking package techniques are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base carrier; providing a first integrated circuit having a first integrated circuit inactive side and a first integrated circuit active side; coupling a second integrated circuit, having a second integrated circuit inactive side and a second integrated circuit active side, to the first integrated circuit in an active-to-active configuration; attaching the first integrated circuit over the base carrier; attaching a redistribution structure over the first integrated circuit; and forming a base encapsulation over the redistribution structure, the base encapsulation having a recess partially exposing the redistribution structure.

The present invention provides an integrated circuit packaging system including: a base carrier; a first integrated circuit having a first integrated circuit inactive side and a first integrated circuit active side; a second integrated circuit, having a second integrated circuit inactive side and a second integrated circuit active side, coupled to the first integrated circuit in an active-to-active configuration with the first integrated circuit over the base carrier; a redistribution structure over the first integrated circuit; and a base encapsulation over the redistribution structure, the base encapsulation having a recess partially exposing the redistribution structure.

The present invention provides a method of manufacture of an integrated circuit packaging system including: providing a base carrier; providing a first integrated circuit having a first integrated circuit inactive side and a first integrated circuit active side; attaching a first device-device connector to the first integrated circuit active side; coupling a second integrated circuit, having a second integrated circuit inactive side and a second integrated circuit active side, to the first integrated circuit in an active-to-active configuration; attaching the first integrated circuit over the base carrier; mounting an internal package over the second integrated circuit; and forming a base encapsulation over the internal package and covering the first device-device connector.

The present invention provides an integrated circuit packaging system, including: a base carrier; a first integrated circuit having a first integrated circuit inactive side and a first integrated circuit active side; a first device-device connector attached to the first integrated circuit active side; a second integrated circuit, having a second integrated circuit inactive side and a second integrated circuit active side, coupled to the first integrated circuit in an active-to-active configuration with the first integrated circuit over the base carrier; an internal package over the second integrated circuit; and a base encapsulation over the internal package and covering the first device-device connector.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
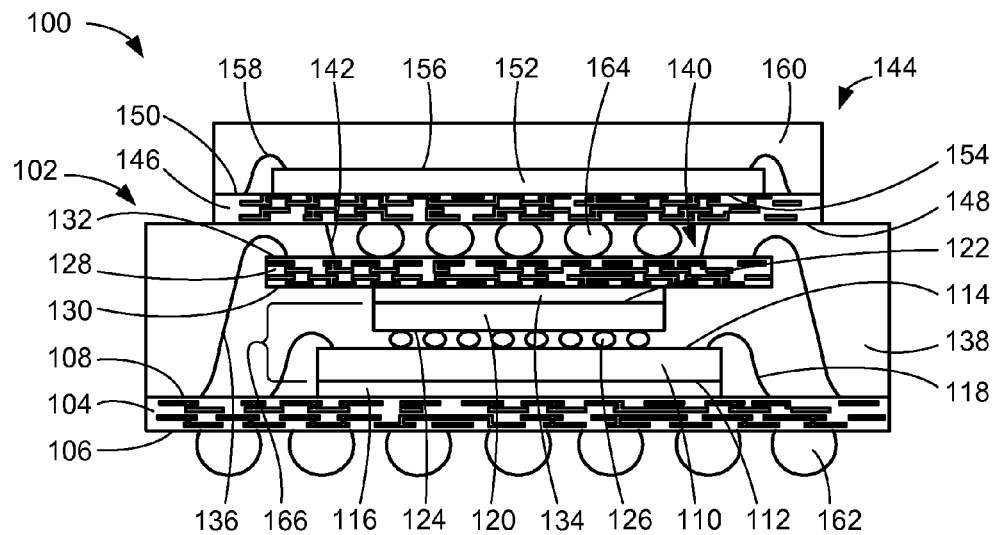
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
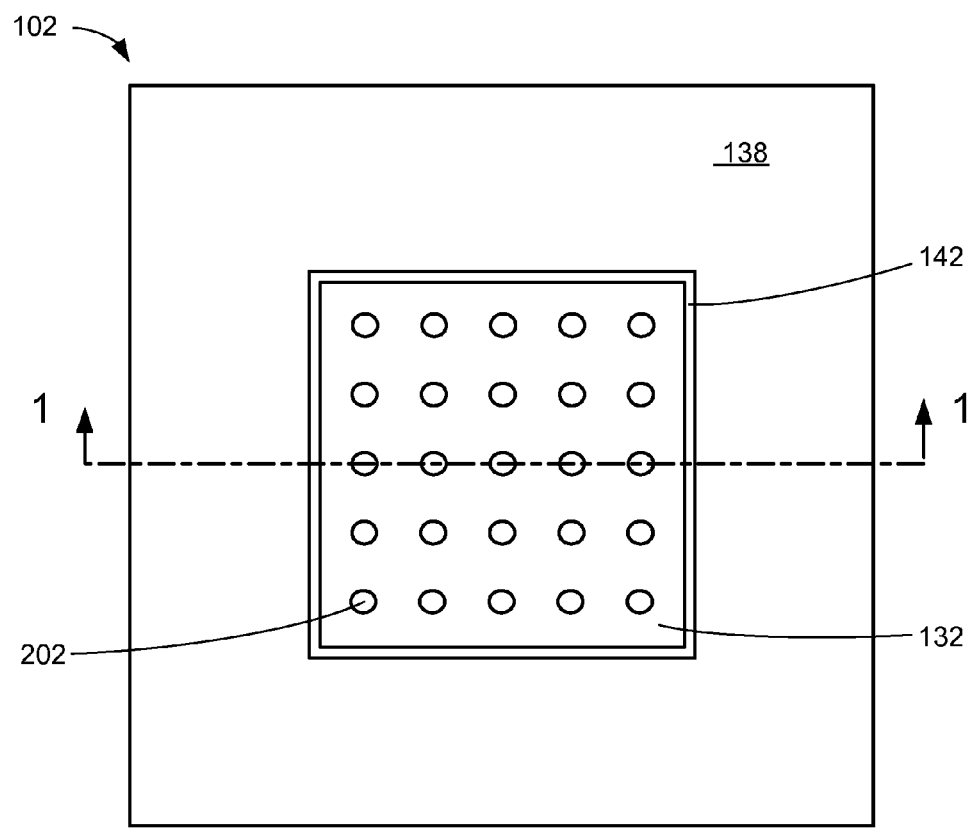
FIG. 2 is a top view of the base package.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a fan-in package-on-package (Fi-PoP) and package-in-package (PiP) with chip-on-chip.

The integrated circuit packaging system 100 can include a base package 102, which is defined as a semiconductor package for stacking another semiconductor package thereon. The base package 102 can include a base carrier 104, which is defined as a support structure for mounting and connecting a semiconductor device thereto including providing electrical connections through the support structure.

As an example, the base carrier 104 can represent a support structure including a lead frame or a multi-layer support structure including a laminated substrate or a ceramic substrate. As a specific example, the base carrier 104 can represent a support structure including a silicon substrate or a substrate with build-up layers.

The base carrier 104 can include a base carrier interconnection side 106 and a base carrier device side 108 opposite the base carrier interconnection side 106. The base carrier interconnection side 106 and the base carrier device side 108 are defined as horizontal surfaces of the base carrier 104, having equal area and opposite orientation, that are connected to an external system (not shown) and a device, respectively.

The base package 102 can include a first integrated circuit 110, which is defined as a semiconductor device having a number of integrated transistors interconnected to form circuits. For example, the first integrated circuit 110 can include a semiconductor device including a flip chip or an integrated circuit die.

The first integrated circuit 110 can include a first integrated circuit inactive side 112 and a first integrated circuit active side 114 opposite the first integrated circuit inactive side 112. The first integrated circuit active side 114 is defined as a side of the first integrated circuit 110 having active circuitry fabricated thereon or having elements for connection to the active circuitry within the first integrated circuit 110. The first integrated circuit active side 114 can face upwardly and away from the base carrier device side 108.

The base package 102 can include a first attach layer 116, which is defined as a structure for holding a semiconductor device to a carrier. For example, the first attach layer 116 can be a die attach material, an underfill, or an adhesive material. The first attach layer 116 can be attached to the base carrier device side 108 and the first integrated circuit inactive side 112.

The base package 102 can include a first base connector 118, which is defined as an electrically conductive connector. The base package 102 can include a plurality of the first base connector 118.

For illustrative purposes, the first base connector 118 is shown as a bond wire, although it is understood that the first base connector 118 can represent any electrically conductive connector. For example, the first base connector 118 can represent an electrically conductive connector including a conductive ball, a conductive stud, or a conductive column.

The first base connector 118 can be coupled, connected, or attached to the base carrier device side 108 and the first integrated circuit active side 114. The first base connector 118 can be attached to a peripheral area of the first integrated circuit 110 at the first integrated circuit active side 114.

The base package 102 can include a second integrated circuit 120, which is defined as a semiconductor device having a number of integrated transistors interconnected to form circuits. The second integrated circuit 120 can include a horizontal length less than a horizontal length of the first integrated circuit 110. For example, the second integrated circuit 120 can include a semiconductor device including a flip chip or an integrated circuit die.

The second integrated circuit 120 can include a second integrated circuit inactive side 122 and a second integrated circuit active side 124 opposite the second integrated circuit inactive side 122. The second integrated circuit active side 124 is defined as a side of the second integrated circuit 120 having active circuitry fabricated thereon or having elements for connection to the active circuitry within the second integrated circuit 120.

The second integrated circuit 120 can be coupled to or mounted over the first integrated circuit 110 in an active-to-active configuration. The active-to-active configuration is defined as a position of the second integrated circuit active side 124 facing the first integrated circuit active side 114.

The base package 102 can include a first device-device connector 126, which is defined as an electrically conductive connector. The base package 102 can include a plurality of the first device-device connector 126.

For illustrative purposes, the first device-device connector 126 is shown as a conductive bump, although it is understood that the first device-device connector 126 can represent any electrically conductive connector. For example, the first device-device connector 126 can represent a conductive micro-bump, a conductive stud, or a conductive column.

The first device-device connector 126 can be attached to the first integrated circuit active side 114 and the second integrated circuit active side 124. The first device-device connector 126 can be attached to a non-peripheral area of the first integrated circuit active side 114. A plurality of the first device-device connector 126 can be attached between the first base connector 118 and another of the first base connector 118.

For example, the first device-device connector 126 can be attached at wafer level. Also for example, the first device-device connector 126 can represent a face-to-face interconnect since the first device-device connector 126 can be attached to the first integrated circuit active side 114 and the second integrated circuit active side 124 with the first integrated circuit active side 114 facing the second integrated circuit active side 124.

The base package 102 can include a redistribution structure 128, which is defined as a support structure for mounting and connecting a semiconductor device thereto including providing electrical connections through the support structure. As an example, the redistribution structure 128 can represent a support structure including an interposer or a substrate. As a specific example, the redistribution structure 128 can represent a support structure including a silicon substrate or a substrate with build-up layers.

The redistribution structure 128 can include a redistribution structure device side 130 and a redistribution structure stack side 132 opposite the redistribution structure device side 130. The redistribution structure device side 130 is defined as a horizontal surface of the redistribution structure 128 that is connected to a device. The redistribution structure stack side 132 is defined as a horizontal surface of the redistribution structure 128 that is connected to a semiconductor package or the external system.

The redistribution structure 128 can be attached, mounted, or positioned over the first integrated circuit 110 and the second integrated circuit 120. The redistribution structure device side 130 can face the second integrated circuit inactive side 122.

The base package 102 can include a second attach layer 134, which is defined as a structure for holding a semiconductor device to a support structure. For example, the second attach layer 134 can be a die attach material, an underfill, or an adhesive material. The second attach layer 134 can be attached to the second integrated circuit inactive side 122 and the redistribution structure device side 130.

The base package 102 can include a second base connector 136, which is defined as an electrically conductive connector. The base package 102 can include a plurality of the second base connector 136.

For illustrative purposes, the second base connector 136 is shown as a bond wire, although it is understood that the second base connector 136 can represent any electrically conductive connector. For example, the second base connector 136 can represent an electrically conductive connector including a conductive ball, a conductive stud, or a conductive column.

The second base connector 136 can be attached to the base carrier device side 108 and the redistribution structure stack side 132. The second base connector 136 can be attached to a peripheral area of the redistribution structure 128 at the redistribution structure stack side 132.

The base package 102 can include a base encapsulation 138, which is defined as a package cover of a semiconductor package to seal a semiconductor device providing mechanical and environmental protection. The base encapsulation 138 can be formed covering the base carrier device side 108, the first integrated circuit 110, the first attach layer 116, the first base connector 118, the second integrated circuit 120, the first device-device connector 126, the redistribution structure device side 130, a portion of the redistribution structure stack side 132, the second attach layer 134, and the second base connector 136.

The base encapsulation 138 can include a recess 140, which is defined as an opening in the base encapsulation 138 exposing the redistribution structure 128. The recess 140 can expose a portion of the redistribution structure stack side 132 for mounting or connecting a stack semiconductor device or a stack semiconductor package. The recess 140 can expose a non-peripheral area of the redistribution structure stack side 132.

The base encapsulation 138 can include a non-horizontal side 142, which is defined as a side of the base encapsulation 138 that forms the boundary of the recess 140. The non-horizontal side 142 can be at an obtuse angle to the top extent of the base encapsulation 138 to facilitate release of a mold system (not shown) in a molding process of the base encapsulation 138.

For illustrative purposes, the non-horizontal side 142 is shown at an obtuse angle to the top extent of the base encapsulation 138, although it is understood that the non-horizontal side 142 can be at any angle to the top extent. For example, the non-horizontal side 142 can be perpendicular to the top extent.

The integrated circuit packaging system 100 can include a stack package 144, which is defined as an integrated circuit package. The stack package 144 can be mounted over the base package 102. The stack package 144 can include a stack carrier 146, which is defined as a multi-layer support structure for mounting and connecting a semiconductor device thereto including providing electrical connections through the support structure.

As an example, the stack carrier 146 can represent a support structure including a substrate or a lead frame. As a specific example, the stack carrier 146 can represent a support structure including a silicon substrate or a substrate with build-up layers.

The stack carrier 146 can include a stack carrier interconnection side 148 and a stack carrier device side 150 opposite the stack carrier interconnection side 148. The stack carrier interconnection side 148 and the stack carrier device side 150 are defined as horizontal surfaces of the stack carrier 146, having equal area and opposite orientation to each other.

The stack package 144 can include a stack integrated circuit 152, which is defined as a semiconductor device having a number of integrated transistors interconnected to form circuits. For example, the stack integrated circuit 152 can include a semiconductor device including a wirebond integrated circuit or an integrated circuit die.

The stack carrier interconnection side 148 can be connected to the base package 102. The stack carrier device side 150 can be connected to the stack integrated circuit 152.

The stack integrated circuit 152 can include a stack integrated circuit inactive side 154 and a stack integrated circuit active side 156 opposite the stack integrated circuit inactive side 154. The stack integrated circuit active side 156 is defined as a side of the stack integrated circuit 152 having active circuitry fabricated thereon or having elements for connection to the active circuitry within the stack integrated circuit 152.

The stack integrated circuit 152 can be mounted over the stack carrier 146 with the stack integrated circuit inactive side 154 facing the stack carrier device side 150. For example, the stack integrated circuit inactive side 154 can be attached to the stack carrier device side 150 by a layer including a die attach material, an underfill, or an adhesive material.

The stack package 144 can include a stack connector 158, which is defined as an electrically conductive connector. The stack package 144 can include a plurality of the stack connector 158.

For illustrative purposes, the stack connector 158 is shown as a bond wire, although it is understood that the stack connector 158 can represent any electrically conductive connector. For example, the stack connector 158 can represent a conductive ball.

The stack connector 158 can be attached to the stack carrier device side 150 and the stack integrated circuit active side 156. The stack connector 158 can be attached to a peripheral area of the stack integrated circuit 152 at the stack integrated circuit active side 156.

The stack package 144 can include a stack encapsulation 160, which is defined as a package cover of a semiconductor package to seal a semiconductor device providing mechanical and environmental protection. The stack encapsulation 160 can be formed covering the stack carrier device side 150, the stack integrated circuit active side 156, and the stack connector 158.

The integrated circuit packaging system 100 can include a base interconnect 162, which is defined as an electrically conductive connector. The integrated circuit packaging system 100 can include a plurality of the base interconnect 162. The base interconnect 162 can be attached to the base carrier interconnection side 106 to provide electrical connection between the base carrier 104 and the external system.

The integrated circuit packaging system 100 can include a stack interconnect 164, which is defined as an electrically conductive connector. The integrated circuit packaging system 100 can include a plurality of the stack interconnect 164. The stack interconnect 164 can be attached to the redistribution structure stack side 132 and the stack carrier interconnection side 148. The stack interconnect 164 can be attached within the recess 140.

The base package 102 can include a base assembly 166, which is defined as a portion of the base package 102 with semiconductor devices that are connected to each other. The base assembly 166 can include the first integrated circuit 110 attached to the second integrated circuit 120 with the first device-device connector 126.

The base assembly 166 can be mounted over the base carrier device side 108. The base assembly 166 can be coupled to the base carrier device side 108 with the first base connector 118 in between.

It has been discovered that the first device-device connector 126 attached to the first integrated circuit active side 114 and the second integrated circuit active side 124 provides significant package height reduction as well as cost reduction since spacers are no longer necessary between the first integrated circuit 110 and the second integrated circuit 120.

It has been unexpectedly found that the first integrated circuit active side 114 facing the second integrated circuit active side 124 improves performance of electrical signals between the first integrated circuit 110 and the stack package 144 by significantly reducing routing complexity of the base carrier 104 resulting in the base carrier having shorter routing traces for the first integrated circuit 110 to electrically connect to the stack package 144 with the first base connector 118, the second base connector 136, the redistribution structure 128, and the stack interconnect 164.

It has been unexpectedly determined that the base assembly 166 formed before package assembly improves yield and reliability with only known good dies, one of which is shown as the second integrated circuit 120, coupled to instances of the first integrated circuit 110.

Referring now to FIG. 2, therein is shown a top view of the base package 102. The top view depicts the base encapsulation 138 having the non-horizontal side 142. The base encapsulation 138 can expose a portion of the redistribution structure stack side 132 within the recess 140 of FIG. 1.

The redistribution structure 128 of FIG. 1 can include a conductive pad 202, which is defined as an attachment site of the redistribution structure 128 for the stack interconnect 164 of FIG. 1 to electrically connect to the redistribution structure 128. The redistribution structure 128 can include a plurality of the conductive pad 202 formed in an array exposed within the recess 140.

For example, the plurality of the conductive pad 202 can be formed in a full array with the conductive pad 202 evenly spaced from another of the conductive pad 202. Also for example, the conductive pad 202 can represent a landing pad or a contact pad.

Figure 3:
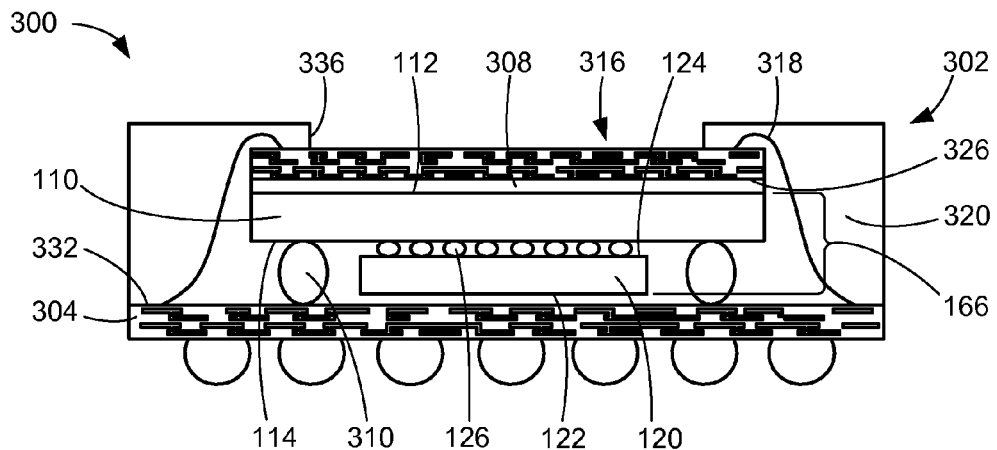
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. In a manner similar to the integrated circuit packaging system 100 of FIG. 1, the integrated circuit packaging system 300 includes a base package 302 having a base carrier 304, a first attach layer 308, a first base connector 310, a redistribution structure 316, a second base connector 318, a base encapsulation 320, and the base assembly 166.

The first integrated circuit 110 can include the first integrated circuit inactive side 112 attached to a redistribution structure device side 326 of the redistribution structure 316 with the first attach layer 308. The first integrated circuit 110 can include the first integrated circuit active side 114 attached to the second integrated circuit active side 124 of the second integrated circuit 120 with the first device-device connector 126. The first integrated circuit 110 can include a horizontal length greater than a horizontal length of the second integrated circuit 120.

The first integrated circuit 110 can be attached over the base carrier 304. The first integrated circuit active side 114 can be coupled or attached to a base carrier device side 332 of the base carrier 304 with the first base connector 310. The first integrated circuit active side 114 coupled or attached to the base carrier device side 332 with the first base connector 310 is defined as the first base connector 310 is electrically and directly connected to the first integrated circuit active side 114 and the base carrier device side 332. The first integrated circuit active side 114 can face downwardly and towards the base carrier device side 332.

The first base connector 310 can be attached to a peripheral area of the first integrated circuit 110 at the first integrated circuit active side 114. A plurality of the first device-device connector 126 can be attached between the first base connector 310 and another of the first base connector 310.

The first base connector 310 can include a vertical height greater than a sum of vertical heights of the second integrated circuit 120 and the first device-device connector 126 providing spacing between the second integrated circuit inactive side 122 of the second integrated circuit 120 and the base carrier device side 332. For example, the first base connector 310 can represent a conductive connector including a bump-interconnect.

For illustrative purposes, the first base connector 310 is shown as a conductive bump, although it is understood that the first base connector 310 can represent any conductive connector. For example, the first base connector 310 can represent a conductive connector including a conductive stud or a conductive column.

The base encapsulation 320 can include a non-horizontal side 336. For illustrative purposes, the non-horizontal side 336 is shown perpendicular to a top extent of the base encapsulation 320, although it is understood that the non-horizontal side 336 can be at any angle to the top extent. For example, the non-horizontal side 336 can be at an obtuse angle to the top extent.

It has been discovered that the first base connector 310 attached to the first integrated circuit active side 114 and the base carrier device side 332 reduces overall package height profile providing spacing for the second integrated circuit active side 124 to be attached to the first integrated circuit active side 114 and between the first base connector 310 and another of the first base connector 310.

Figure 4:
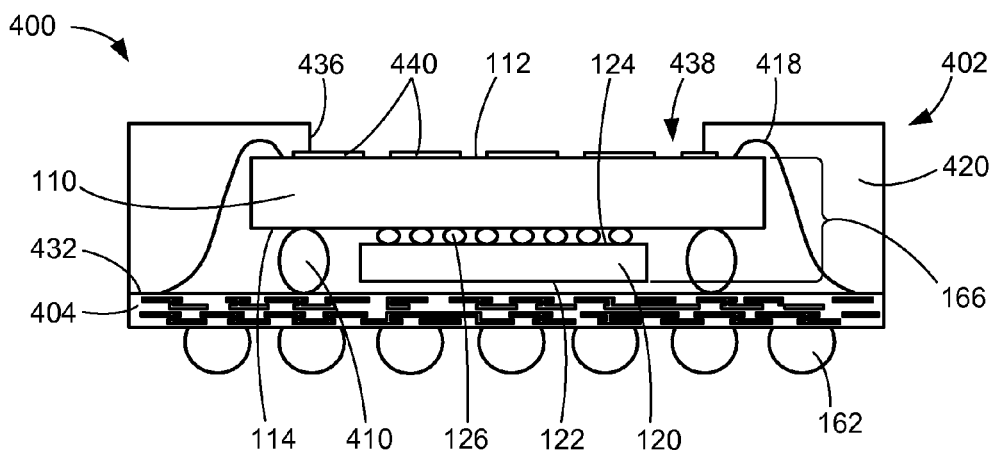
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. In a manner similar to the integrated circuit packaging system 100 of FIG. 1, the integrated circuit packaging system 400 includes a base package 402 having a base carrier 404, a first base connector 410, a second base connector 418, a base encapsulation 420, and the base assembly 166.

The first integrated circuit 110 can include the first integrated circuit inactive side 112 partially exposed from the base encapsulation 420. The first integrated circuit 110 can include the first integrated circuit active side 114 attached to the second integrated circuit active side 124 of the second integrated circuit 120 with the first device-device connector 126. The first integrated circuit 110 can include a horizontal length greater than a horizontal length of the second integrated circuit 120.

The first integrated circuit 110 can be attached over the base carrier 404. The first integrated circuit active side 114 can be attached to a base carrier device side 432 of the base carrier 404 with the first base connector 410. The first integrated circuit active side 114 can face downwardly and towards the base carrier device side 432.

The first base connector 410 can include a vertical height greater than sum of vertical heights of the second integrated circuit 120 and the first device-device connector 126 providing spacing between the second integrated circuit inactive side 122 of the second integrated circuit 120 and the base carrier device side 432. For example, the first base connector 410 can represent a conductive connector including a bump-interconnect.

For illustrative purposes, the first base connector 410 is shown as a conductive bump, although it is understood that the first base connector 410 can represent any conductive connector. For example, the first base connector 410 can represent a conductive connector including a conductive stud or a conductive column.

The first base connector 410 can be attached to a peripheral area of the first integrated circuit 110 at the first integrated circuit active side 114. A plurality of the first device-device connector 126 can be attached between the first base connector 410 and another of the first base connector 410.

The base encapsulation 420 can include a non-horizontal side 436. For illustrative purposes, the non-horizontal side 436 is shown perpendicular to a top extent of the base encapsulation 420, although it is understood that the non-horizontal side 436 can be at any angle to the top extent. For example, the non-horizontal side 436 can be at an obtuse angle to the top extent.

The first integrated circuit 110 can include a backside, shown as the first integrated circuit inactive side 112, partially exposed from the base encapsulation 420. The first integrated circuit inactive side 112 can be exposed within a recess 438 of the base encapsulation 420.

The integrated circuit packaging system 400 can include a redistribution structure 440, which is defined as a conductive structure that relocates an electrical signal or an electrical potential level. The redistribution structure 440 can relocate an electrical signal or an electrical potential level between the second base connector 418 and a stack component (not shown), such as a semiconductor package or a semiconductor device.

The redistribution structure 440 can be attached to the second base connector 418. The redistribution structure 440 can redistribute the electrical signal or the electrical potential level between the first integrated circuit 110 and the stack component with the second base connector 418, the base carrier 404, and the first base connector 410.

The redistribution structure 440 can be attached, positioned, or formed directly on the first integrated circuit inactive side 112 of the base assembly 166. The redistribution structure 440 can be partially exposed from the base encapsulation 420 within the recess 438. The redistribution structure 440 can be partially covered by the base encapsulation 420. A portion of the redistribution structure 440 can be attached to the stack component.

It has been discovered that the redistribution structure 440 directly on the first integrated circuit inactive side 112 significantly reduces overall package height profile since a carrier or substrate is not required to provide electrical connectivity between the first integrated circuit 110 and the stack component. A further electrical connection is formed among the first integrated circuit 110, the second integrated circuit 120, the redistribution structure 440, the base interconnect 162, or a combination thereof.

Figure 5:
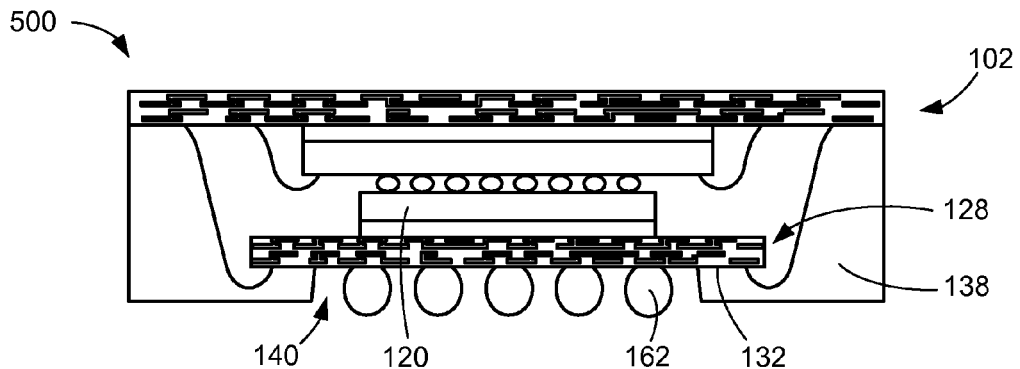
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. In a manner similar to the integrated circuit packaging system 100 of FIG. 1, the integrated circuit packaging system 500 includes the base package 102 and the base interconnect 162. The base package 102 is shown as an inverted fan-in package-on-package (Fi-PoP).

The base package 102 can include the redistribution structure 128 mounted over the second integrated circuit 120. The base package 102 can include the redistribution structure stack side 132 of the redistribution structure 128 attached to the base interconnect 162, which can be within the recess 140 of the base encapsulation 138.

It has been discovered that the redistribution structure 128 attached to the base interconnect 162 significantly reduces overall package height profile with the base interconnect 162 attached within the recess 140 to electrically connect the base package 102 to an external system (not shown).

Figure 6:
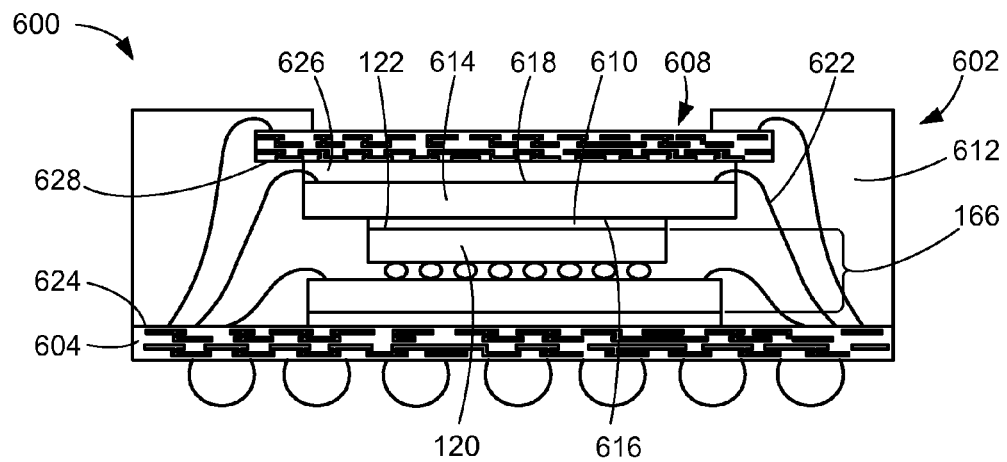
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. In a manner similar to the integrated circuit packaging system 100 of FIG. 1, the integrated circuit packaging system 600 includes a base package 602 having a base carrier 604, a redistribution structure 608, a second attach layer 610, a base encapsulation 612, and the base assembly 166.

The base package 602 can include a third integrated circuit 614, which is defined as a semiconductor device having a number of integrated transistors that are interconnected to form circuits. The third integrated circuit 614 can include a horizontal length greater than a horizontal length of the second integrated circuit 120.

For example, the third integrated circuit 614 can include a semiconductor device including a wirebond integrated circuit or an integrated circuit die. Also for example, the base package 602 can include a number of semiconductor devices, one of which is shown as the third integrated circuit 614, over the second integrated circuit 120.

The third integrated circuit 614 can include a third integrated circuit inactive side 616 and a third integrated circuit active side 618 opposite the third integrated circuit inactive side 616. The third integrated circuit active side 618 is defined as a side of the third integrated circuit 614 having active circuitry fabricated thereon or having elements for connection to the active circuitry within the third integrated circuit 614.

The third integrated circuit 614 can be mounted over the second integrated circuit 120 of the base assembly 166. The third integrated circuit inactive side 616 can face the second integrated circuit inactive side 122 of the second integrated circuit 120. The third integrated circuit inactive side 616 can be attached to the second integrated circuit inactive side 122 with the second attach layer 610.

The base package 602 can include a third base connector 622, which is defined as an electrically conductive connector. The base package 602 can include a plurality of the third base connector 622.

For illustrative purposes, the third base connector 622 is shown as a bond wire, although it is understood that the third base connector 622 can represent any electrically conductive connector. For example, the third base connector 622 can represent a conductive ball.

The third base connector 622 can be attached to a base carrier device side 624 of the base carrier 604 and the third integrated circuit active side 618. The third base connector 622 can be attached to a peripheral area of the third integrated circuit 614 at the third integrated circuit active side 618.

The base package 602 can include a spacer 626, which is defined as a structure that is used to provide spacing above the third integrated circuit active side 618 for the third base connector 622 to be attached to the third integrated circuit 614. The spacer 626 can be formed directly on or attached to the third integrated circuit active side 618 and a redistribution structure device side 628 of the redistribution structure 608. The spacer 626 can cover a portion of the third base connector 622.

For example, the spacer 626 can include a penetrable material including a wire-in-film (WIF), an epoxy, a penetrable film adhesive, a B-stage material, or a viscous gel. Also for example, the spacer 626 can include characteristics of being flowable and curable.

The base encapsulation 612 can be formed over the third integrated circuit 614, the third base connector 622, and the spacer 626. The base encapsulation 612 can cover portions of the third integrated circuit 614, the third base connector 622, and the spacer 626.

It has been discovered that the third integrated circuit 614 mounted over the second integrated circuit 120 with the second attach layer 610 provides package height profile reduction while providing increase of device integration.

It has been unexpectedly found that the spacer 626 improves reliability by providing protection to the third base connector 622 attached to the third integrated circuit active side 618.

Figure 7:
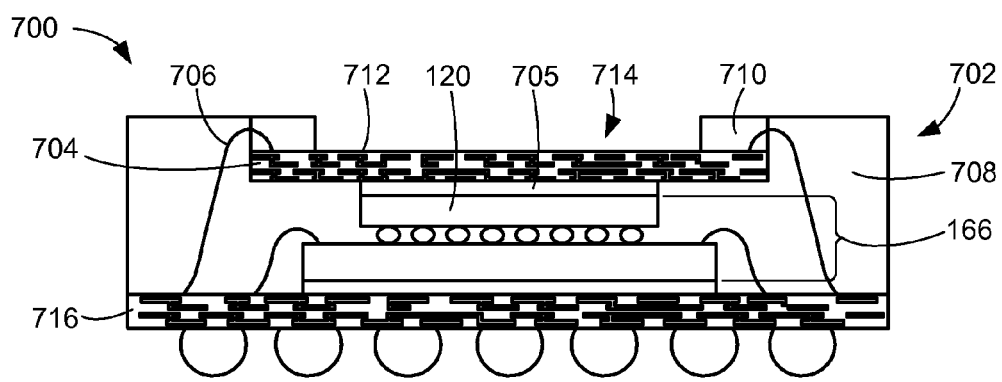
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention. In a manner similar to the integrated circuit packaging system 100 of FIG. 1, the integrated circuit packaging system 700 includes a base package 702 having a redistribution structure 704, a second attach layer 705, a second base connector 706, a base encapsulation 708, and the base assembly 166.

The redistribution structure 704 can be mounted over the second integrated circuit 120. The redistribution structure 704 can be attached to the second integrated circuit 120 with the second attach layer 705.

The base package 702 can include a barrier 710, which is defined as a structure providing a dam to contain or prevent an encapsulant from overflowing onto a redistribution structure stack side 712 of the redistribution structure 704 when the base encapsulation 708 is formed. The barrier 710 can be formed directly on a peripheral area of the redistribution structure 704 at the redistribution structure stack side 712.

The barrier 710 can cover a portion of the second base connector 706. The barrier 710 can be formed so that the base encapsulation 708 can be formed with a recess 714 exposing a portion of the redistribution structure 704 at the redistribution structure stack side 712.

For example, the barrier 710 can be formed with a penetrable material including a wire-in-film (WIF), an epoxy, a resin, a penetrable film adhesive, a B-stage material, or a viscous gel. Also for example, the barrier 710 can include characteristics of being flowable and curable.

In a manner similar to the integrated circuit packaging system 100, the integrated circuit packaging system 700 includes the base package 702 having a base carrier 716. The base carrier 716 can be electrically connected or attached to the redistribution structure stack side 712 with the second base connector 706.

It has been discovered that the barrier 710 improves reliability by providing protection to the second base connector 706 attached to the redistribution structure stack side 712.

It has been unexpectedly found that the barrier 710 allows molding of the base encapsulation 708 to be formed with the recess 714 without a dedicated mold chase and prevents contamination, of the exposed portion of the redistribution structure stack side 712, from flash of the base encapsulation 708.

Figure 8:
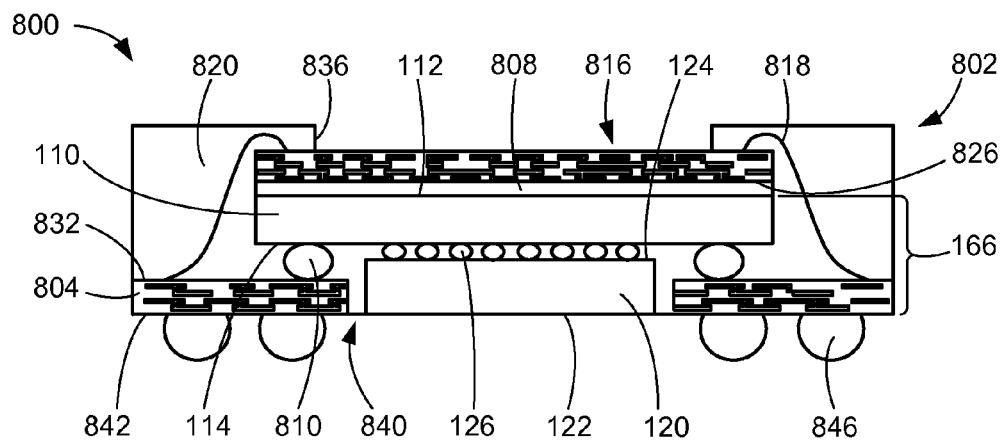
FIG. 8 is a cross-sectional view of an integrated circuit packaging system in a seventh embodiment of the present invention.

Referring now to FIG. 8, therein is shown a cross-sectional view of an integrated circuit packaging system 800 in a seventh embodiment of the present invention. In a manner similar to the integrated circuit packaging system 100 of FIG. 1, the integrated circuit packaging system 800 includes a base package 802 having a base carrier 804, a first attach layer 808, a first base connector 810, a redistribution structure 816, a second base connector 818, a base encapsulation 820, and the base assembly 166.

The first integrated circuit 110 can include the first integrated circuit inactive side 112 attached to a redistribution structure device side 826 of the redistribution structure 816 with the first attach layer 808. The first integrated circuit 110 can include the first integrated circuit active side 114 attached to the second integrated circuit active side 124 of the second integrated circuit 120 with the first device-device connector 126. The first integrated circuit 110 can include a horizontal length greater than a horizontal length of the second integrated circuit 120.

The first integrated circuit 110 can be attached over the base carrier 804. The first integrated circuit active side 114 can be attached to a base carrier device side 832 of the base carrier 804 with the first base connector 810. The first integrated circuit active side 114 can face downwardly and towards the base carrier device side 832.

The first base connector 810 can be attached to a peripheral area of the first integrated circuit 110 at the first integrated circuit active side 114. A plurality of the first device-device connector 126 can be attached between the first base connector 810 and another of the first base connector 810. For example, the first base connector 810 can represent a conductive connector including a bump-interconnect.

The first base connector 810 can include a vertical height greater than a vertical height of the first device-device connector 126. A sum of vertical heights of the base carrier 804 and the first base connector 810 can be approximately equal to a sum of vertical heights of the second integrated circuit 120 and the first device-device connector 126.

For illustrative purposes, the first base connector 810 is shown as a conductive bump, although it is understood that the first base connector 810 can represent any conductive connector. For example, the first base connector 810 can represent a conductive connector including a conductive stud or a conductive column.

The base encapsulation 820 can include a non-horizontal side 836. For illustrative purposes, the non-horizontal side 836 is shown perpendicular to a top extent of the base encapsulation 820, although it is understood that the non-horizontal side 836 can be at any angle to the top extent. For example, the non-horizontal side 836 can be at an obtuse angle to the top extent.

The base carrier 804 can include a window 840, which is defined as a hole through a base carrier interconnection side 842 of the base carrier 804 and the base carrier device side 832. A portion of the second integrated circuit 120 of the base assembly 166 can be within the window 840. For example, the window 840 can represent a cavity or a recess through the base carrier 804.

The base encapsulation 820 can cover the portion of the second integrated circuit 120 within the window 840. The base encapsulation 820 can expose the second integrated circuit inactive side 122 of the second integrated circuit 120. Planes of a bottom extent of the base encapsulation 820, the second integrated circuit inactive side 122 of the base assembly 166, and the base carrier interconnection side 842 can be coplanar with each other.

In a manner similar to the integrated circuit packaging system 100, the integrated circuit packaging system 800 includes a base interconnect 846. A plurality of the base interconnect 846 can be attached to the base carrier interconnection side 842 and surrounding the window 840.

It has been discovered that the portion of the second integrated circuit 120 within the window 840 provides package height profile reduction.

Figure 9:
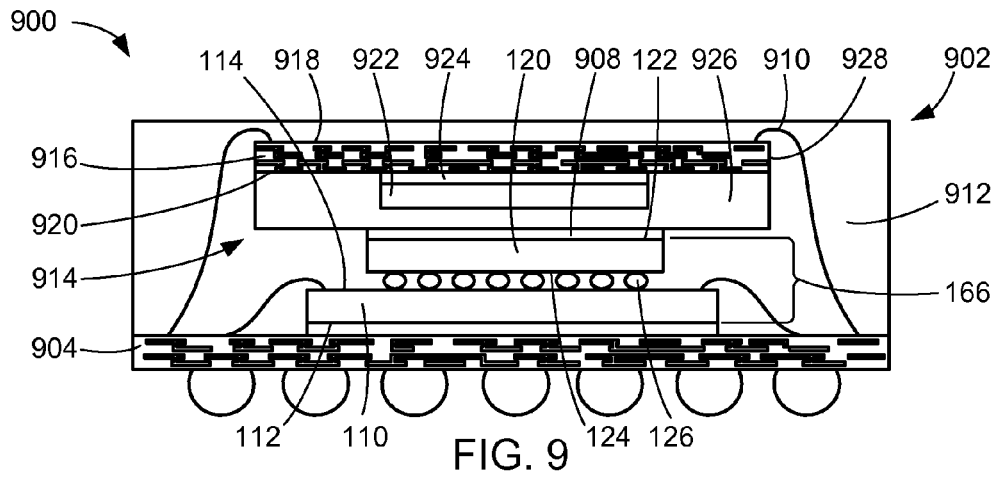
FIG. 9 is a cross-sectional view of an integrated circuit packaging system in an eighth embodiment of the present invention.

Referring now to FIG. 9, therein is shown a cross-sectional view of an integrated circuit packaging system 900 in an eighth embodiment of the present invention. In a manner similar to the integrated circuit packaging system 100 of FIG. 1, the integrated circuit packaging system 900 includes a base package 902 having a base carrier 904, a second attach layer 908, a second base connector 910, a base encapsulation 912, and the base assembly 166.

The base package 902 can include an internal package 914, which is defined as a semiconductor package within the base package 902. For example, the internal package 914 can represent an internal stacking module (ISM). Also for example, the integrated circuit packaging system 900 can include a package-in-package (PiP), shown as the internal package 914 in the base package 902.

The internal package 914 can include a redistribution structure 916, which is defined as a multi-layer support structure for mounting and connecting a semiconductor device thereto including providing electrical connections through the support structure. As an example, the redistribution structure 916 can represent a support structure including a substrate or a lead frame. As a specific example, the redistribution structure 916 can represent a support structure including a silicon substrate or a substrate with build-up layers.

The redistribution structure 916 can include a redistribution structure interconnection side 918 and a redistribution structure device side 920 opposite the redistribution structure interconnection side 918. The redistribution structure interconnection side 918 and the redistribution structure device side 920 are defined as horizontal surfaces of the redistribution structure 916, having equal area and opposite orientation, that are connected to the base carrier 904 and a semiconductor device, respectively.

The internal package 914 can include an internal integrated circuit 922, which is defined as a semiconductor device having a number of integrated transistors interconnected to form circuits. For example, the internal integrated circuit 922 can include a semiconductor device including an integrated circuit die, a wirebond integrated circuit, or a flip chip.

The redistribution structure interconnection side 918 can be connected to the base carrier 904. The redistribution structure interconnection side 918 can be connected to the internal integrated circuit 922.

The internal package 914 can include an internal attach layer 924, which is defined as a structure for holding a semiconductor device to a carrier. For example, the internal attach layer 924 can be a die attach material, an underfill, or an adhesive material. The internal attach layer 924 can be attached to an inactive side of the internal integrated circuit 922 and the redistribution structure device side 920.

For illustrative purposes, the internal package 914 is shown without an internal electrical connector (not shown) attached to an active side of the internal integrated circuit 922 and the redistribution structure device side 920, although it is understood that the internal package 914 can include the internal electrical connector. For example, the internal package 914 can include the internal electrical connector representing an electrically conductive connector including a bond wire or a conductive bump.

The internal package 914 can include an internal encapsulation 926, which is defined as a package cover of a semiconductor package to seal a semiconductor device providing mechanical and environmental protection. The internal encapsulation 926 can be formed covering the redistribution structure device side 920, the internal integrated circuit 922, and the internal attach layer 924.

The internal package 914 can be mounted over the second integrated circuit 120 of the base assembly 166. The internal package 914 can be inverted such that the redistribution structure interconnection side 918 can face away from the second integrated circuit 120 and the internal encapsulation 926 can be attached directly to the second integrated circuit 120 with the second attach layer 908.

The base encapsulation 912 can be formed over the internal package 914, the redistribution structure interconnection side 918, and the second base connector 910. The base encapsulation 912 can cover the first device-device connector 126, the second base connector 910, the redistribution structure 916, and the internal encapsulation 926.

At least one of a number of the redistribution structure interconnection side 918 can be electrically attached to the base carrier 904 with a number of the second base connector 910. The number of the second base connector 910 can be adjacent structure non-horizontal sides 928 of the redistribution structure 916.

The first integrated circuit 110 can include the first integrated circuit inactive side 112 and the first integrated circuit active side 114. The first integrated circuit active side 114 can be attached to the first device-device connector 126. The first integrated circuit 110 can be attached over the base carrier 904.

The second integrated circuit 120 can include the second integrated circuit inactive side 122 and the second integrated circuit active side 124. The second integrated circuit 120 can be coupled to the first integrated circuit 110 in an active-to-active configuration. The active-to-active configuration is defined as a position of the second integrated circuit active side 124 facing the first integrated circuit active side 114.

It has been discovered that the internal package 914 mounted over the second integrated circuit 120 with the second attach layer 908 provides package height profile reduction while providing increase of device integration.

Figure 10:
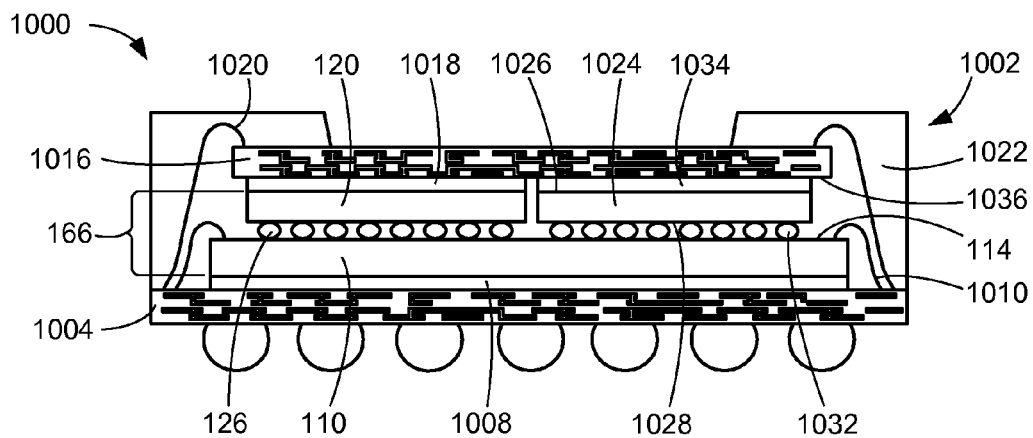
FIG. 10 is a cross-sectional view of an integrated circuit packaging system in a ninth embodiment of the present invention.

Referring now to FIG. 10, therein is shown a cross-sectional view of an integrated circuit packaging system 1000 in a ninth embodiment of the present invention. In a manner similar to the integrated circuit packaging system 100 of FIG. 1, the integrated circuit packaging system 1000 includes a base package 1002 having a base carrier 1004, a first attach layer 1008, a first base connector 1010, a redistribution structure 1016, a second attach layer 1018, a second base connector 1020, a base encapsulation 1022, and the base assembly 166.

The base package 1002 can include a third integrated circuit 1024, which is defined as a semiconductor device having a number of integrated transistors interconnected to form circuits. For example, the third integrated circuit 1024 can include a semiconductor device including a flip chip integrated circuit die.

The third integrated circuit 1024 can include a third integrated circuit inactive side 1026 and a third integrated circuit active side 1028 opposite the third integrated circuit inactive side 1026. The third integrated circuit active side 1028 is defined as a side of the third integrated circuit 1024 having active circuitry fabricated thereon or having elements for connection to the active circuitry within the third integrated circuit 1024.

The third integrated circuit 1024 can be coupled to or mounted over the first integrated circuit 110 of the base assembly 166 in an active-to-active configuration. The active-to-active configuration is defined as a position of the third integrated circuit active side 1028 facing the first integrated circuit active side 114.

The base package 1002 can include a second device-device connector 1032, which is defined as an electrically conductive connector. The base package 1002 can include a plurality of the second device-device connector 1032.

For illustrative purposes, the second device-device connector 1032 is shown as a conductive bump, although it is understood that the second device-device connector 1032 can represent any electrically conductive connector. For example, the second device-device connector 1032 can represent a conductive micro-bump, a conductive stud, or a conductive column.

The second device-device connector 1032 can be attached to the first integrated circuit active side 114 and the third integrated circuit active side 1028. The second device-device connector 1032 can be attached to a non-peripheral area of the first integrated circuit active side 114. A plurality of the second device-device connector 1032 and the first device-device connector 126 can be attached between the first base connector 1010 and another of the first base connector 1010.

For example, the second device-device connector 1032 can be attached at wafer level. Also for example, the second device-device connector 1032 can represent a face-to-face interconnect since the second device-device connector 1032 can be attached to the first integrated circuit active side 114 and the third integrated circuit active side 1028 with the first integrated circuit active side 114 facing the third integrated circuit active side 1028.

The base package 1002 can include a third attach layer 1034, which is defined as a structure for holding a semiconductor device to a support structure. For example, the third attach layer 1034 can be a die attach material, an underfill, or an adhesive material. The third attach layer 1034 can be attached to the third integrated circuit inactive side 1026 and a redistribution structure device side 1036 of the redistribution structure 1016.

The base encapsulation 1022 can be formed over the third integrated circuit 1024, the second device-device connector 1032, and the third attach layer 1034. The base encapsulation 1022 can cover the third integrated circuit 1024, the second device-device connector 1032, and the third attach layer 1034.

It has been discovered that multiple flip chips, shown as the second integrated circuit 120 and the third integrated circuit 1024, mounted on the first integrated circuit 110 provides package height profile reduction with the second integrated circuit 120 mounted side-by-side or adjacent to the third integrated circuit 1024.

Figure 11:
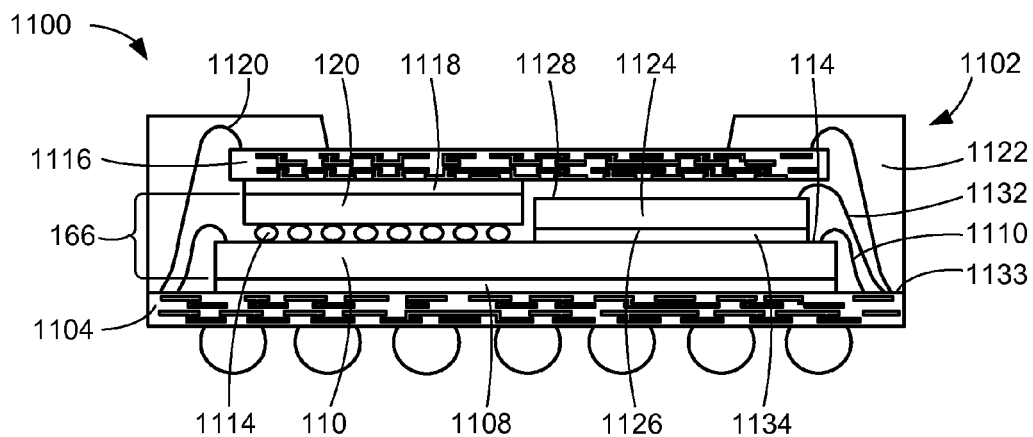
FIG. 11 is a cross-sectional view of an integrated circuit packaging system in a tenth embodiment of the present invention.

Referring now to FIG. 11, therein is shown a cross-sectional view of an integrated circuit packaging system 1100 in a tenth embodiment of the present invention. In a manner similar to the integrated circuit packaging system 100 of FIG. 1, the integrated circuit packaging system 1100 includes a base package 1102 having a base carrier 1104, a first attach layer 1108, a first base connector 1110, a device-device connector 1114, a redistribution structure 1116, a second attach layer 1118, a second base connector 1120, a base encapsulation 1122, and the base assembly 166.

The base package 1102 can include a third integrated circuit 1124, which is defined as a semiconductor device having a number of integrated transistors interconnected to form circuits. For example, the third integrated circuit 1124 can include a semiconductor device including a wirebond integrated circuit or an integrated circuit die.

The third integrated circuit 1124 can include a third integrated circuit inactive side 1126 and a third integrated circuit active side 1128 opposite the third integrated circuit inactive side 1126. The third integrated circuit active side 1128 is defined as a side of the third integrated circuit 1124 having active circuitry fabricated thereon or having elements for connection to the active circuitry within the third integrated circuit 1124.

The third integrated circuit 1124 can be mounted over the first integrated circuit 110. The third integrated circuit active side 1128 can face away from the first integrated circuit active side 114 of the first integrated circuit 110.

The base package 1102 can include a third base connector 1132, which is defined as an electrically conductive connector. The base package 1102 can include a plurality of the third base connector 1132. For example, the third base connector 1132 can represent an electrically conductive connector including a bond wire.

The third base connector 1132 can be attached to the third integrated circuit active side 1128 and a base carrier device side 1133 of the base carrier 1104. The third base connector 1132 can be attached to a peripheral area of the base carrier 1104 at the base carrier device side 1133. The third base connector 1132 can be attached to a peripheral area of the third integrated circuit 1124 at the third integrated circuit active side 1128.

The base package 1102 can include a third attach layer 1134, which is defined as a structure for holding a semiconductor device to a support structure. For example, the third attach layer 1134 can be a die attach material, an underfill, or an adhesive material. The third attach layer 1134 can be attached to the third integrated circuit inactive side 1126 and the first integrated circuit active side 114.

The base encapsulation 1122 can be formed over the third integrated circuit 1124, the third base connector 1132, and the third attach layer 1134. The base encapsulation 1122 can cover the third integrated circuit 1124, the third base connector 1132, and the third attach layer 1134.

It has been discovered that mixture of multiple chips, shown as the second integrated circuit 120 and the third integrated circuit 1124, mounted on the first integrated circuit 110 provides package height profile reduction with the second integrated circuit 120 mounted side-by-side or adjacent to the third integrated circuit 1124.

Figures 12, 13:
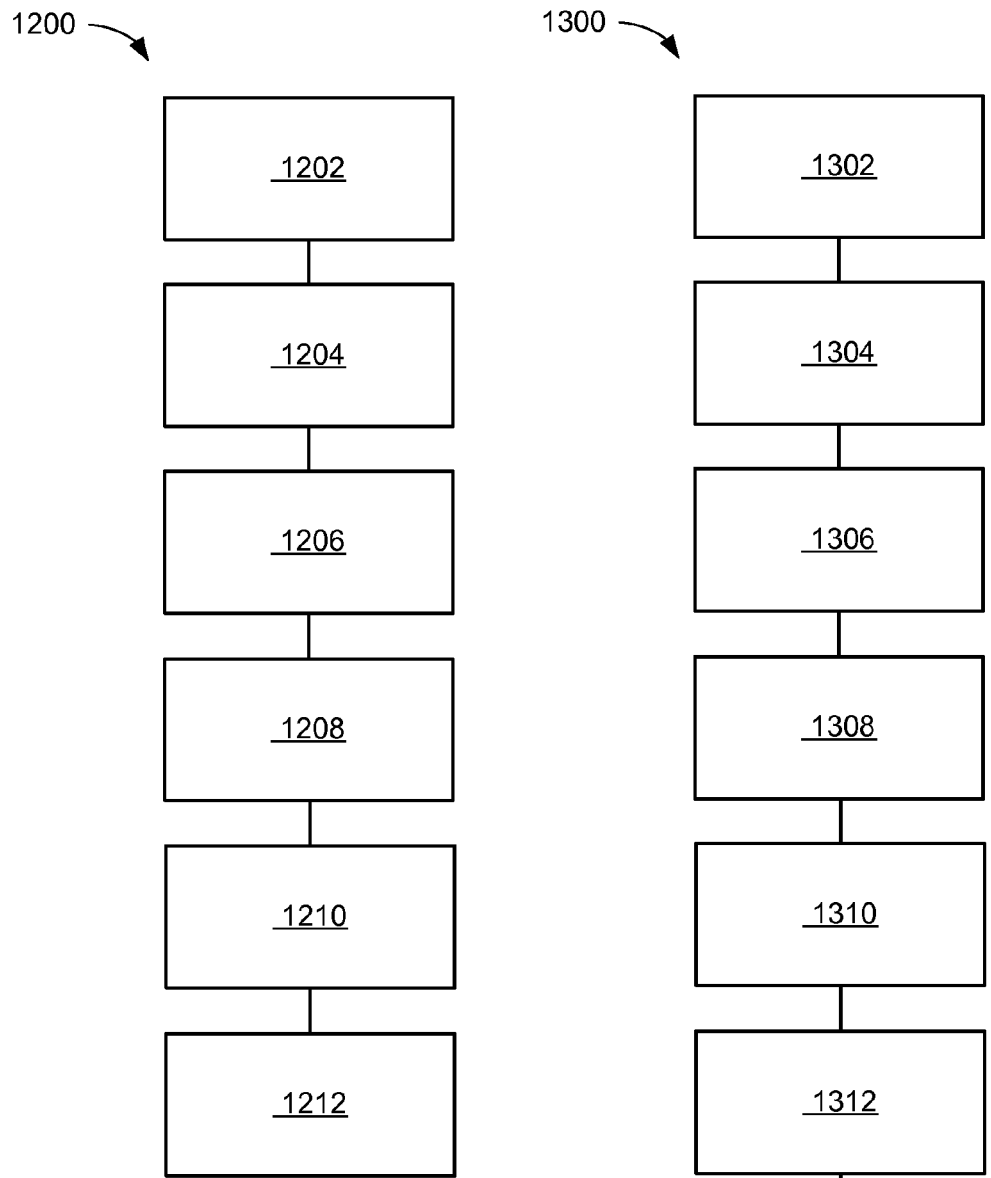
FIG. 12 is a flow chart of a method of manufacture of an integrated circuit packaging system in a further embodiment of the present invention.
FIG. 13 is a flow chart of a method of manufacture of an integrated circuit packaging system in a further embodiment of the present invention.

Referring now to FIG. 12, therein is shown a flow chart of a method 1200 of manufacture of an integrated circuit packaging system in a further embodiment of the present invention. The method 1200 includes: providing a base carrier in a block 1202; providing a first integrated circuit having a first integrated circuit inactive side and a first integrated circuit active side in a block 1204; coupling a second integrated circuit, having a second integrated circuit inactive side and a second integrated circuit active side, to the first integrated circuit in an active-to-active configuration in a block 1206; attaching the first integrated circuit over the base carrier in a block 1208; attaching a redistribution structure over the first integrated circuit in a block 1210; and forming a base encapsulation over the redistribution structure, the base encapsulation having a recess partially exposing the redistribution structure in a block 1212.

Referring now to FIG. 13, therein is shown a flow chart of a method 1300 of manufacture of an integrated circuit packaging system in a further embodiment of the present invention. The method 1300 includes: providing a base carrier in a block 1302; providing a first integrated circuit having a first integrated circuit inactive side and a first integrated circuit active side in a block 1304; attaching a first device-device connector to the first integrated circuit active side in a block 1306; coupling a second integrated circuit, having a second integrated circuit inactive side and a second integrated circuit active side, to the first integrated circuit in an active-to-active configuration in a block 1308; attaching the first integrated circuit over the base carrier in a block 1310; mounting an internal package over the second integrated circuit in a block 1312; and forming a base encapsulation over the internal package and covering the first device-device connector in a block 1314.

Thus, it has been discovered that the integrated circuit packaging system of the present invention furnishes important and heretofore unknown and unavailable solutions, capabilities, and functional aspects for an integrated circuit packaging system with interconnect. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base carrier;
   providing a first integrated circuit having a first integrated circuit inactive side and a first integrated circuit active side;
   coupling a second integrated circuit, having a second integrated circuit inactive side and a second integrated circuit active side, to the first integrated circuit in an active-to-active configuration;
   attaching the first integrated circuit over the base carrier;
   attaching a redistribution structure directly on the second integrated circuit inactive side; and forming a base encapsulation over the redistribution structure, the base encapsulation having a recess partially covering and partially exposing the redistribution structure.

2. The method as claimed in claim 1 further comprising coupling a first base connector between the first integrated circuit active side and the base carrier.

3. The method as claimed in claim 1, further comprising:
attaching a second base connector to the redistribution structure and the base carrier; and
forming a barrier directly on the redistribution structure and covering a portion of the second base connector.

4. A method of manufacture of an integrated circuit packaging system comprising:
providing a base carrier;
providing a first integrated circuit having a first integrated circuit inactive side and a first integrated circuit active side;
attaching a first device-device connector to the first integrated circuit active side;
coupling a second integrated circuit, having a second integrated circuit inactive side and a second integrated circuit active side, to the first integrated circuit in an active-to-active configuration with the first device-device connector;
attaching the first integrated circuit over the base carrier;
attaching a redistribution structure on the second integrated circuit inactive side; and
forming a base encapsulation over the redistribution structure, the base encapsulation having a recess partially exposing and partially covering the redistribution structure.

5. The method as claimed in claim 4 further comprising attaching a first base connector to the first integrated circuit and the base carrier.

6. The method as claimed in claim 4 wherein providing the base carrier includes providing the base carrier having a window with a portion of the first integrated circuit within the window.

7. An integrated circuit packaging system comprising:
a base carrier;
a first integrated circuit having a first integrated circuit inactive side and a first integrated circuit active side;
a second integrated circuit, having a second integrated circuit inactive side and a second integrated circuit active side, to the first integrated circuit in an active-to-active configuration with the first integrated circuit over the base carrier;
a redistribution structure directly on the second integrated circuit inactive side; and
a base encapsulation over the redistribution structure, the base encapsulation having a recess partially exposing and partially covering the redistribution structure.

8. The system as claimed in claim 7 further comprising a first base connector between the first integrated circuit active side and the base carrier.

9. The system as claimed in claim 7 further comprising:
a second base connector attached to the redistribution structure and the base carrier; and
a barrier directly on the redistribution structure and covering a portion of the second base connector.

10. The system as claimed in claim 7 further comprising:
a first device-device connector attached to the first integrated circuit active side; and
wherein:
the second integrated circuit is coupled to the first integrated circuit with the first device-device connector.

11. The system as claimed in claim 10 further comprising a first base connector attached to the first integrated circuit and the base carrier.

12. The system as claimed in claim 10 wherein the base carrier includes a window with a portion of the first integrated circuit within the window.

* * * * *

UNITED STATES PATENT AND TRADEMARK OFFICE
CERTIFICATE OF CORRECTION

PATENT NO. : 8,633,059 B2  
APPLICATION NO. : 13/105814  
DATED : January 21, 2014  
INVENTOR(S) : Do et al.

It is certified that error appears in the above-identified patent and that said Letters Patent is hereby corrected as shown below:

In the Claims:

Column 20, claim 7, line 7, delete "side, to" and insert therefor
--side, coupled to--

Signed and Sealed this
First Day of December, 2015

Michelle K. Lee
*Director of the United States Patent and Trademark Office*